United States Patent
Munday

(10) Patent No.: US 10,403,781 B1
(45) Date of Patent: Sep. 3, 2019

(54) SILICON-BASED PHOTODETECTORS WITH EXPANDED BANDWIDTH

(71) Applicant: Jeremy Nathan Munday, N. Bethesda, MD (US)

(72) Inventor: Jeremy Nathan Munday, N. Bethesda, MD (US)

(73) Assignee: University of Maryland, College Park, College Park, MD (US)

( * ) Notice: Subject to any disclaimer, the term of this patent is extended or adjusted under 35 U.S.C. 154(b) by 0 days.

(21) Appl. No.: 15/610,894

(22) Filed: Jun. 1, 2017

Related U.S. Application Data

(60) Provisional application No. 62/344,126, filed on Jun. 1, 2016.

(51) Int. Cl.
| | |
|---|---|
| H01L 27/15 | (2006.01) |
| H01L 29/06 | (2006.01) |
| H01L 31/02 | (2006.01) |
| H01L 31/07 | (2012.01) |
| H01L 31/105 | (2006.01) |
| H01L 31/108 | (2006.01) |
| H01L 31/0224 | (2006.01) |

(52) U.S. Cl.
CPC ......... *H01L 31/1085* (2013.01); *H01L 27/15* (2013.01); *H01L 29/0619* (2013.01); *H01L 31/02024* (2013.01); *H01L 31/022416* (2013.01); *H01L 31/07* (2013.01); *H01L 31/105* (2013.01)

(58) Field of Classification Search
None
See application file for complete search history.

(56) References Cited

U.S. PATENT DOCUMENTS

| | | | | |
|---|---|---|---|---|
| 2008/0157253 | A1* | 7/2008 | Starikov | H01L 31/09 257/435 |
| 2015/0054966 | A1* | 2/2015 | Wang | H04N 5/361 348/187 |
| 2015/0372175 | A1* | 12/2015 | Yu | H01L 27/1443 250/338.4 |

OTHER PUBLICATIONS

Andrea, A. & Nader, E. Plasmonic and metamaterial cloaking: physical mechanisms and potentials. J. Opt. A Pure Appl. Opt. 10, 93002 (2008).

Dotan, H. et al. Resonant light trapping in ultrathin films for water splitting. Nat. Mater. 12, 158-164 (2012).

(Continued)

*Primary Examiner* — Jay C Chang
(74) *Attorney, Agent, or Firm* — Rosenberg, Klein & Lee

(57) ABSTRACT

A hot carrier photodetector has been developed that absorbs approximately 80% of broadband infrared radiation by using a planar nanoscale back metal contact to silicon. Based on the principles of the hot carriers generation in ultrathin metal films, silicon-based CMOS image sensors are developed which operate in the IR diapason. The device uses absorption in an ultrathin metallic nanostructure to generate therein a non-equilibrium electron distribution which subsequently is injected into the silicon material via a Schottky contact at the Si body, thus generating a photoresponse to an incident IR radiation. A pixeled array including interconnected hot carriers metallic nanostructured cell(s) and traditional RGB elements is envisioned to enable RGB-IR imaging from a single silicon based wafer.

16 Claims, 11 Drawing Sheets

(56) References Cited

OTHER PUBLICATIONS

Knight, M. W., Sobhani, H., Nordlander, P. & Halas, N. J. Photodetection with Active Optical Antennas. Science (80-.). 332, (2011).
Li, W. & Valentine, J. Metamaterial perfect absorber based hot electron photodetection. Nano Lett. 14, 3510-3514 (2014).
Bhattacharyya, S., Ghosh, S., Chaurasiya, D. & Srivastava, K. V. Bandwidth-enhanced dual-band dual-layer polarization-independent ultra-thin metamaterial absorber. Appl. Phys. A 118, 207-215 (2015).
Hägglund, C., Apell, S. P. & Kasemo, B. Maximized Optical Absorption in Ultrathin Films and Its Application to Plasmon-Based Two-Dimensional Photovoltaics. Nano Lett. 10, 3135-3141 (2010).
Llorens, J. M., Buencuerpo, J. & Postigo, P. A. Absorption features of the zero frequency mode in an ultra-thin slab. Appl. Phys. Lett. 105, 231115 (2014).
Kats, M. A., Blanchard, R., Genevet, P. & Capasso, F. Nanometre optical coatings based on strong interference effects in highly absorbing media. Nat. Mater. 12, 20-24 (2013).
Mirshafieyan, S. S., Guo, H. & Guo, J. Zeroth Order Fabry-Perot Resonance Enabled Strong Light Absorption in Ultrathin Silicon Films on Different Metals and Its Application for Color Filters. IEEE Photonics J. 8, 1-12 (2016).
Song, H. et al. Nanocavity Enhancement for Ultra-Thin Film Optical Absorber. Adv. Mater. 26, 2737-2743 (2014).
Weaver, J. H., Colavita, E., Lynch, D. W. & Rosei, R. Low-energy interband absorption in bcc Fe and hcp Co. Phys. Rev. B 19, 3850-3856 (1979).
Dalal, V. L. Simple Model for Internal Photoemission. J. Appl. Phys. 42, 2274-2279 (1971).
Zheng, B. Y. et al. Distinguishing between plasmon-induced and photoexcited carriers in a device geometry. Nat. Commun. 6, 7797 (2015).
Gong, C. & Leite, M. S. Noble Metal Alloys for Plasmonics. ACS Photonics 3, 507-513 (2016).
Scales, C. & Berini, P. Thin-Film Schottky Barrier Photodetector Models. IEEE J. Quantum Electronics, vol. 46, No. 5, 633-643 (May 2010).

* cited by examiner

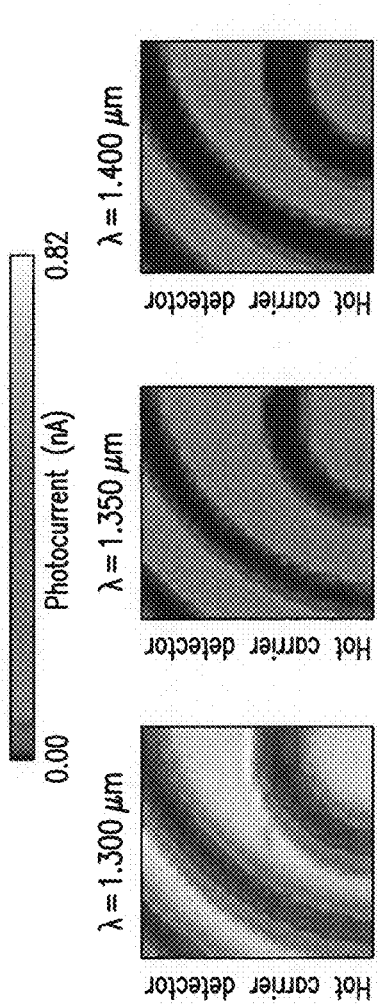
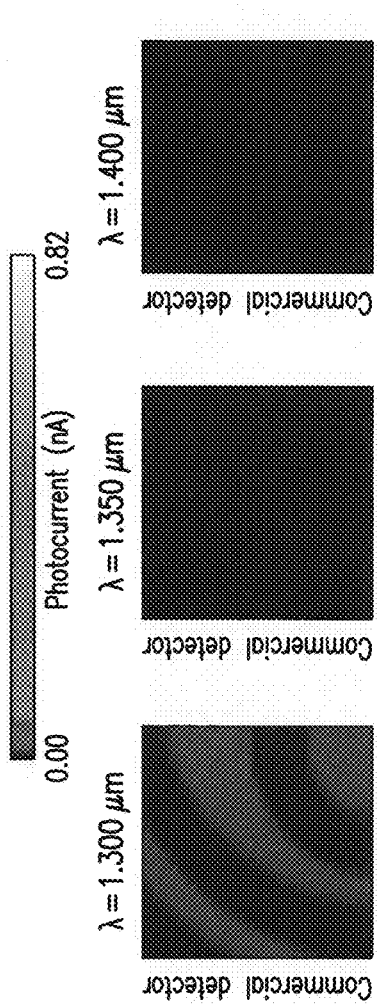

US 10,403,781 B1

SILICON-BASED PHOTODETECTORS WITH EXPANDED BANDWIDTH

REFERENCE TO RELATED APPLICATIONS

This Utility Patent Application is based on the Provisional Patent Application 62/344,126 filed on 1 Jun. 2016.

FIELD OF THE INVENTION

The present invention is directed to silicon (Si) based photodetectors, and particularly, to silicon-based photodetectors capable of operating in the Infrared (IR) spectrum.

More in particular, the present invention is directed to infrared silicon-based photodetectors utilizing hot carriers generation in an ultrathin metal contact formed at the silicon body which absorbs about 80% of broadband radiation to produce photocurrent.

The present invention is also directed to silicon-based CMOS (Complementary Metal-Oxide-Semiconductor) image sensors capable of operating in the infrared diapason zone based on absorption from a thin metallic nanostructure formed in contact with the Si body to generate a photoresponse to the incident light using a non-equilibrium hot electron distribution which is injected into the silicon body via the thin metallic nanostructure.

Further, the present invention is directed to a silicon based photodetecting structure which constitutes a pixeled array formed with cells fabricated with metallic nanostructures contributing in hot carriers generation responsive to IR incident radiation and traditional RGB (red-green-blue) cells to enable RGB-IR imaging from a single silicon-based device.

BACKGROUND OF THE INVENTION

Next-generation optoelectronic devices will require new materials and systems with characteristics not found in present-day materials. Traditional devices exploit metals, oxides, and semiconductors, each with their own functionality. For example, metals are typically formed to form contacts for application of a gate voltage or to supply current to a device. When high frequency electromagnetic radiation is involved, the functionality of the metal becomes more complex and obey plasmonics principles.

The field of plasmonics, which deals with the coupled oscillations of an electric charge and electromagnetic radiation, has found diverse applications in light localization, subwavelength focusing, etc., and has resulted in a wide range of devices.

Plasmonics has shown great potential for next generation devices which are based on strong electromagnetic field confinement. However, ohmic losses which originate in the cooling of excited (or so-called "hot") carriers, have kept many devices from being developed and have led to a search for alternative materials.

Development of new ultrafast devices would be possible if carriers could be collected prior to cooling (or thermalization). Due to short diffusion lengths and scattering times of the carriers, devices are necessarily small (10 s-100 s of nm), and are thus excellent candidates for future miniaturized electronics.

Surface plasmon interactions can typically be divided into two cases: (a) localized surface plasmons and (b) propagating surface plasmon polaritons. For either case, an incident electromagnetic wave couples to the free charges in a metal and creates a coupled oscillation at the metal-dielectric interface. These oscillations are typically confined to a small volume and result in high field intensities. In addition, larger metallic particles (~100 nm) may cause enhanced scattering of the incident light, while smaller particles (~10 s nm) cause enhanced absorption within the metal particles. The ability of metallic nanostructures to effectively confine and scatter light has led to many applications of plasmonics to photodetectors.

Manipulation of light-matter interactions enabled functionally that surpasses the limitations of traditional materials for applications such as optical cloaking, water splitting for hydrogen production, and optical energy conversion, has been of great interest in the past decade. In particular, controlling transmission and reflection from material interfaces can improve optical coatings for filters and the absorption efficiency of photodetectors and solar cells. This desire for optical control has led to the development of metamaterials, which exhibit optical properties that are not found in nature. Metamaterials that enhance localized electric fields through exciting plasmonic resonances in metallic nanostructures have been developed to increase absorption and extend the bandwidth of semiconductors. However, these metamaterials require complicated and costly nanofabrication techniques making them difficult to commercialize.

Recently, high absorption in ultra-thin films has been theorized and experimentally demonstrated by exciting zeroth order Fabry-Perot (FP) resonances. These resonant cavities combine interference effects and phase delay to obtain high absorption and are a cost effective alternative to plasmonic metamaterials because of their ease of fabrication. While zeroth order FP cavities have been used to increase absorption in ultra-thin semiconductors above their bandgap, and their generated photocurrent has been harnessed for water splitting, they have not been utilized for hot carrier generation in metals.

Hot carrier devices such as plasmonic metamaterial absorbers and nano-antenna arrays have successfully generated a photoresponse from sub-bandgap photons in silicon. However, they require complicated and costly nanofabrication techniques that limit their advantage over low bandgap semiconductors.

Silicon-based CMOS image sensors are pervasive and found in many consumer electronics (e.g., cell phones, cameras, etc.). While these sensors allow for imaging of visible light, they are unable to capture the infrared (IR) light due to the mismatch with the bandgap of silicon (Si). In order to image radiation in the infrared spectrum, a separate image sensor is needed, typically based on such semiconductors as Ge, InGaAs, etc. The necessity of a separate IR image sensor interferes with miniaturization of the image sensor, and complicates the fabrication process.

It is economically advantageous to explore methods of photodetection using silicon in the IR/telecommunications regime, below its energy bandgap, because of the abundance and relatively low cost of silicon compared to lower bandgap semiconductors.

It would be highly advantageous to utilize principles of plasmonics and, particularly, hot carriers generation and injection from ultrathin metal films formed in contact with silicon to obtain a photoresponse to IR radiation.

It also would be highly desirable to provide a hot carriers based photodetection system capable of expanding the bandwidth of silicon detectors into the Infrared Spectrum by generating photocurrent from photons with energy below the silicon bandgap which would be advantageous for many applications requiring optical energy conversion due to the fact that silicon is a well-understood, naturally abundant and inexpensive material for electronic systems.

SUMMARY OF THE INVENTION

It is an object of the present invention to provide a silicon-based photosensor which is easily integrated into commercial Si devices while absorbing approximately 80% of broadband IR radiation and which does not require a complicated manufacturing process thus attaining low fabrication costs.

It is another object of the invention to provide a Si-based IR imaging system based on hot carriers generation in a nanometer-scale optically absorbing coating, which permits straightforward incorporation into fabrication of commercial silicon devices.

It is a further object of the present invention to provide a silicon-based CMOS (Complementary Metal-Oxide-Semiconductor) image sensor system that is capable of operating in the IR frequency range using hot electron injection from a plasmonic metasurface.

It is an additional object of the present invention to provide a silicon-based CMOS image sensor system operating based on the absorption from a thin metallic nanostructure to generate a non-equilibrium electron distribution which is injected into the silicon body via the Schottky contact with the Si body thus generating photoresponse.

Furthermore, it is an object of the present invention to provide a silicon-based photodetecting metallic nanostructure operating in the infrared spectrum which is easily integrated into a pixeled array formed with traditional RGB elements, thus enabling RGB-IR imaging from a single silicon-based device.

In one aspect, the present invention is directed to an Si-based infrared photodetection system which is based on the generation of hot carriers in nanometer-scale metal optical coatings. This system comprises at least one IR photodetecting cell manufactured with a Si (silicon) substrate having first and second opposing surfaces and a Schottky contact formed on the second (back side) surface of the Si substrate. The Schottky contact is formed with a thin conductive film having a nanometer scale thickness h, which is fabricated in substantially contiguous contact with the second surface of the Si substrate. The Schottky contact creates an energetic barrier having a height $q\Phi_B$ between the Si substrate and the thin conductive film.

Upon illumination of the Si substrate with radiation having a wavelength $\lambda_0$ and incident upon the first surface with photon energy below the Si energy bandgap, the radiation passes through the Si substrate in a direction towards the second surface, and is absorbed in the conductive film of the Schottky contact. The absorbed radiation excites hot carriers in the thin conductive film which have an excitation energy exceeding the barrier height $q\Phi_B$. Hot carriers are injected into the Si substrate, thus creating a photoresponse to the incident radiation.

The subject Si-based photodetecting system further includes a dielectric anti-reflection coating formed on the first surface of the Si substrate, and an ohmic contact formed on at least a portion of the first surface of the Si substrate.

Preferably, the Si-based photodetecting system further includes at least first and second electrical connections coupled to the ohmic contact and the thin conducting film, respectively. The photoresponse to the incident radiation is obtained between the first and second electrical connections.

The thin conducting film has a refractive index $m=n+ik$, where n and k are real and imaginary parts, respectively, of the refractive index, and wherein $n \approx k \gg 0$ for the wavelengths of the light used for photodetection.

The thin conducting film is preferably formed from a material including at least one of Pt, Fe, Cr, Ti, Cu, Al, Ni, Au, and alloys thereof.

The thickness h of the thin conductive film if significantly shorter than the wavelength $\lambda_0$ of the incident radiation, i.e., $h \ll \lambda_0/2\pi$.

In order to control the subject device performance, the Schottky contact barrier height $q\Phi_B$ can be varied to control the photoresponse. For example, the Schottky contact barrier height $q\Phi_B$ can be reduced by heavily doping the material of the Si-substrate in proximity to the thin conductive film, or can be tuned by applying external bias voltage thereto.

At least one subject IR photodetecting cell may be incorporated into a Si-based CMOS image sensor which includes a CMOS chip formed as a pixeled array formed with the IR photodetecting cell(s) and RGB cells operatively interconnected therebetween.

In the subject Si-based photodetecting system, the second (back side) surface of the Si substrate and the thin conducting film may be flat (un-patterned), or, alternatively, may be patterned to form a periodical nanostructure. The thin conducting film in the periodical nanostructure after the patterning process may be shaped, for example, as conducting microwires, microcones, metallic grating, metallic nanodisk array, 3-D nanostructures, and combinations thereof.

In still another aspect, the present invention is directed to a method of manufacturing a silicon-based photodetector system operating in the infrared (IR) spectrum. The method comprises the steps of:

fabricating at least one IR photodetecting cell by:
forming a Si (silicon) substrate having a Si energy bandgap and fabricated with opposing a first surface and a second (back side) surface, and
forming a Schottky contact formed on the second (back side) surface of the Si substrate by depositing a thin conductive film in substantially contiguous contact with the second surface of said Si substrate, thereby creating an energetic barrier having a height $q\Phi_B$ between the Si substrate and the thin conductive film. The thin film material and the thin film thickness are specifically chosen to enable significant absorption of the incident radiation (which may not be attained in regular Schottky photodetectors).

The operation of the IR photodetecting cell is performed by:
illuminating the first surface of the Si substrate with radiation having a wavelength $\lambda_0$ and a photon energy below the Si energy bandgap. Responsive to the illumination, the incident radiation passes through the Si substrate in a direction towards the second (back side) surface and is absorbed in the thin conductive film of the Schottky contact. Subsequently, hot carriers are excited in the thin conductive film. The hot carriers which have an excitation energy exceeding the barrier height $q\Phi_B$ traverse the Schottky contact and are injected into the Si substrate thus creating a photoresponse to the incident radiation.

The method may further contemplate (as an alternative to a flat back side metallic film) a step of patterning either the second surface of the Si substrate and/or the thin conducting film to contour the thin conducting layer in the form of a periodical nanostructure containing highly absorbing elements. The patterning routine may be applied to the thin conducting film while the Si surface remains flat (un-patterned), or to the Si body with the subsequent deposition of the metal film, or to both the Si body and the metal film with the purpose of forming highly absorbing structures. Thus fabricated, the highly absorbing nanostructures may be shaped, for example, as conducting microwires, microcones, metallic grating, metallic nanodisk array, 3-D nanostructures, and combinations thereof, in contact with the Si substrate at its back side.

These and other objects of the present invention will be apparent from the Detailed Description of the Preferred Embodiment(s) when taken in conjunction with accompanying Patent Drawings.

BRIEF DESCRIPTION OF THE DRAWINGS

FIGS. 6B-6E are images of transmission maps (in the imaged boxed region shown in FIG. 6A) taken by the subject hot carrier photodetector fabricated with a Pt film having the thickness of 15.6 nm;

FIGS. 6F-6I are images of transmission maps (in the imaged boxed region shown in FIG. 6A) taken with a commercial Si photodetector;

FIGS. 8A-8F are representative of different high absorption nanostructures used in the alternative embodiment of the subject device, wherein FIG. 8A shows microwires nanostructures, FIG. 8B shows microcones created by dry etching of a GaAs wafer using Au micro particles as an etch bath, FIG. 8C is representative of the metallic grating nanostructures, FIG. 8D is representative of the chemically etched black silicon, FIG. 8E is a top view of a metallic nano-disk array deposited by mechanical masking and evaporation, and FIG. 8F is a nanostructure using a tobacco mosaic virus as a template which results in a complex 3-D nanostructures.

DETAILED DESCRIPTION OF THE PREFERRED EMBODIMENT(S)

Figure 1:
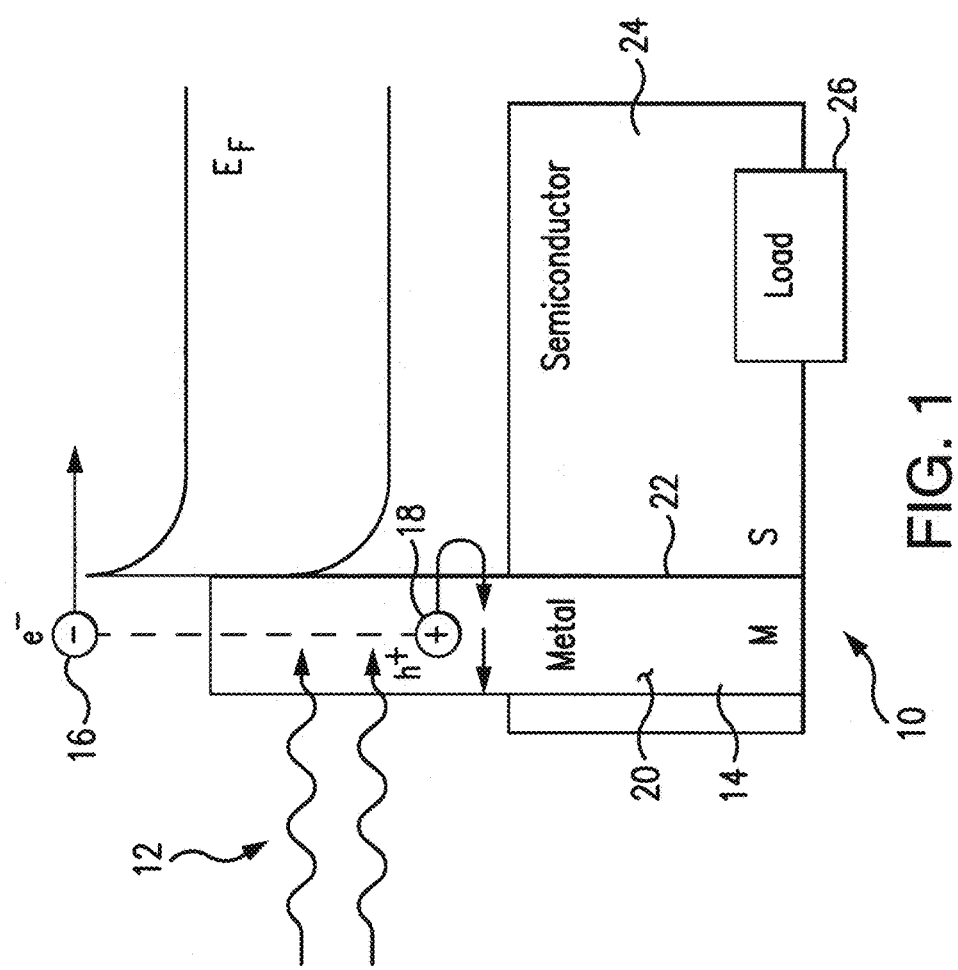
FIG. 1 is a schematic diagram of a metal-semiconductor (M-S) hot carriers plasmonic device based on a Schottky interface.

Production of metal excited electron-hole pairs which lead to photo generation has been observed in a Metal-Semiconductor hot plasmonic structure 10, shown in FIG. 1, which is based on a Schottky interface with a semiconductor, for example, silicon (Si) when light 12 is incident on a metal film 14 in the Schottky contact. The photon-induced electron emission has been attained across the Schottky junction formed at a metal-semiconductor interface. It is shown that sub-bandgap photons 12 are absorbed in the metal 14 and lead to photogenerated current.

For absorption of the light 12 in the metal 14, an electron 16 in the Fermi gas absorbs a photon and is excited to a higher energy state. These excited "hot" electrons 16 leave an empty state in the Fermi gas, generating "hot" holes 18. The "hot" carriers 16, 18 travel within the metal 14 and are subjected to scattering that results in the carriers' relaxation and recombination.

At Infrared (IR) and optical frequencies, the mean free path (MFP) of the electrons can be larger than the thickness 20 of the metal film 14 (which may fall in the range of 10 s of nm).

A fraction of these carriers will reach the Schottky (metal-semiconductor) interface (barrier) 22 and are able to traverse the metal-semiconductor barrier 22 to arrive at the opposite side containing the semiconductor 24. Ultimately, these excited carriers 16 are collected and provide power to an external load 26, as shown in FIG. 1.

Figure 2B:
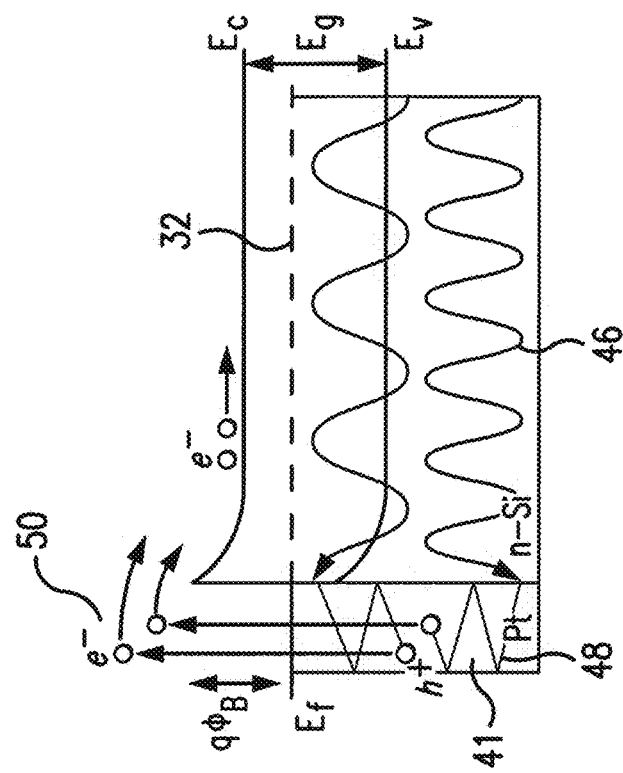
FIG. 2B is an energy band diagram of the subject photodetector showing the light with energy below the bandgap of the silicon material absorbed in the metal contact on the backside (opposite to the illuminated side) of the Si body. The metal contact is shown which generates hot (excited) electrons that are injected into the silicon body when their energy is greater than the barrier height $q\Phi_B$.
Figure 2A:
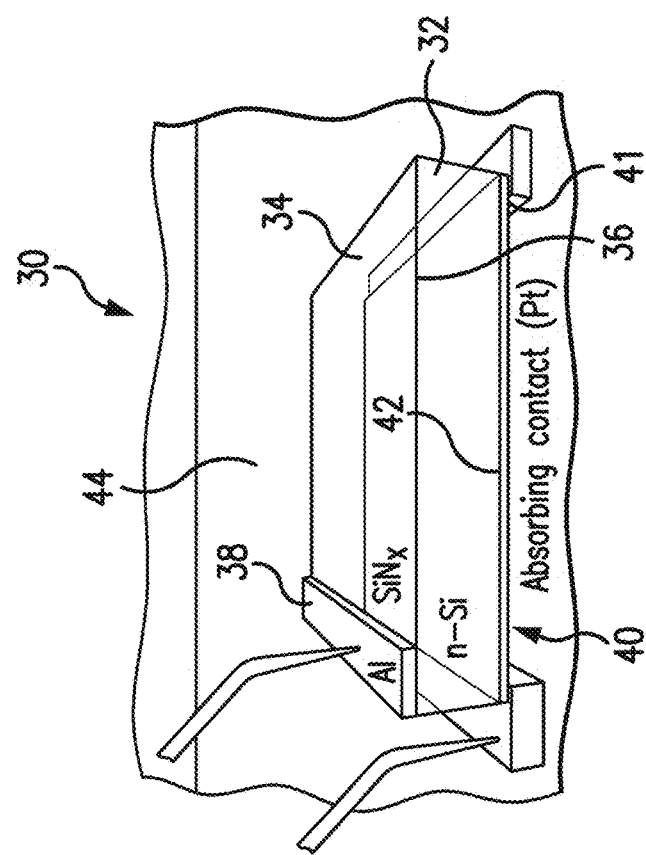
FIG. 2A is a schematic representation of the subject silicon-based infrared photodetector device.

Referring to FIG. 2A-2B, a novel hot carrier IR (Infrared) photodetector 30 has been developed which generates a photoresponse (photocurrent) from an ultrathin metal contact formed at the silicon body and absorbs ~80% of broadband radiation due to a $0^{th}$ order FP (Fabri-Perot) resonance.

The theory of high absorption due to the $0^{th}$ order FP mode in an ultrathin, homogeneous film sandwiched between two non-absorbing dielectrics has been previously developed. Hägglund, et al. ("Maximized Optical Absorption in Ultrathin Films and Its Application to Plasmon-Based Two-Dimensional Photovoltaics", Nano Lett. 10, 3135-3141, 2010) derived the optimal material indices and device conditions for maximized absorption.

From their derivation, a nanometer scale metal film can absorb >50% of all incident radiation under the following conditions:

(i) The real (n) and imaginary (κ) parts of the thin film's refractive index are large and approximately equal (i.e., n≈κ»0 when the refractive index is m=n+iκ);

(ii) The index of the top dielectric ($n_t$) is greater than or equal to the bottom index ($n_b$), and (iii) The optical path length in the film is significantly shorter than the wavelength of incident light, (i.e. h«$\lambda_0$/2π, where h is the film thickness and $\lambda_0$ is the wavelength in air.

The maximum possible absorption in the thin film is not determined by the optical constants of the film or the film's thickness alone, but rather by the optical properties of the dielectrics above and below the film and can be determined by:

$$A_{max} \approx \frac{n_t}{n_t + n_b} \quad \text{(Eq. 1)}$$

Therefore, if $n_t \gg n_b$, it is possible to obtain near perfect absorption of light in films two orders of magnitude thinner than the excitation wavelength. In the case where the top dielectric is silicon and the bottom is air, the maximum possible absorption is 77.8%.

The subject device geometry, and its simplicity, is shown in FIG. 2A. The subject device 30 includes:
(a) an n-type silicon substrate 32,
(b) an anti-reflection coating 34 formed on the top surface 36 of the Si substrate,
(c) an ohmic contact 38 formed on at least a portion of the top surface 36 of the Si substrate 32, and
(d) an ultra-thin absorbing Schottky contact 40 which is formed on the bottom (or back side) surface 42 of the Si substrate 32 by depositing a metal film 41 (also referred to herein as the back side metal film).

The anti-reflecting coating may be manufactured as a single film or as a multi-layer structure.

Upon illumination by photon energy 44 below the bandgap of Si, light passes through the anti-reflecting coating 34 (which may be fabricated, for example, from $SiN_x$, or other dielectric materials having anti-reflection properties and which are suitable for use in photodetectors) and the silicon substrate 32 to be absorbed within the back side metal film 41.

FIG. 2B depicts the band diagram of the subject device 30, where the lines 46 portray the incident radiation 44. The light is resonantly absorbed (portrayed by the lines 48) within the back side metal film 41 prior to exciting the hot carriers 50 which are subsequently injected into the silicon material 32, as long as their energy upon excitation is greater than the barrier height ($q\Phi_B$).

The absorption in the thin film contact 40 to the Si material 32 is analytically calculated using Fresnel equations for a single layer stack of Si/(m=n+iκ)/Air for varying thicknesses, h, of the back side metal film 41 at a wavelength of 1.2 μm.

As shown in FIGS. 3A-3E, the optical indices that satisfy the requirements for high absorption shifts to a narrower region closer to the origin along the n=κ line as the back side metal film thickness h increases.

Figure 3A:
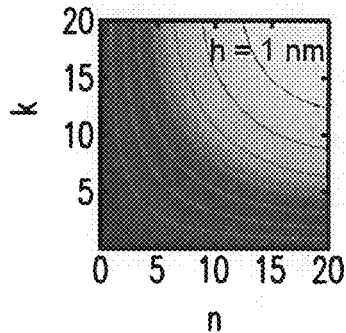
FIGS. 3A-3E are diagrams representative of absorption maps of 1.2 micron light in thin films with thickness of h=1 nm, 5 nm, 10 nm, 30 nm, and 20 nm, respectively.
Figure 3B:
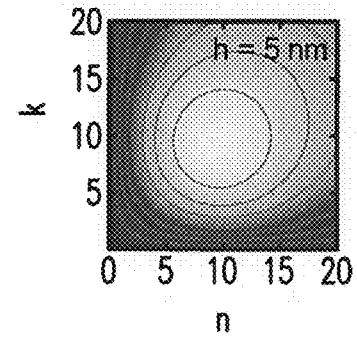
Figure 3C:
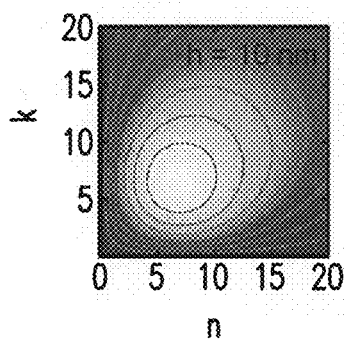
Figure 3D:
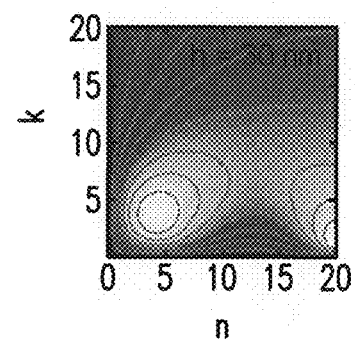

It can be observed in FIG. 3A that it is possible to attain an absorption level of ~77.8% even in the back side metal film having a thickness of as small as 1 nm. However, in order to attain this absorption level, the optical indices of the material would have to meet the condition of n~κ~20. There are, however, currently no existing common metals with those indices.

Figure 3E:
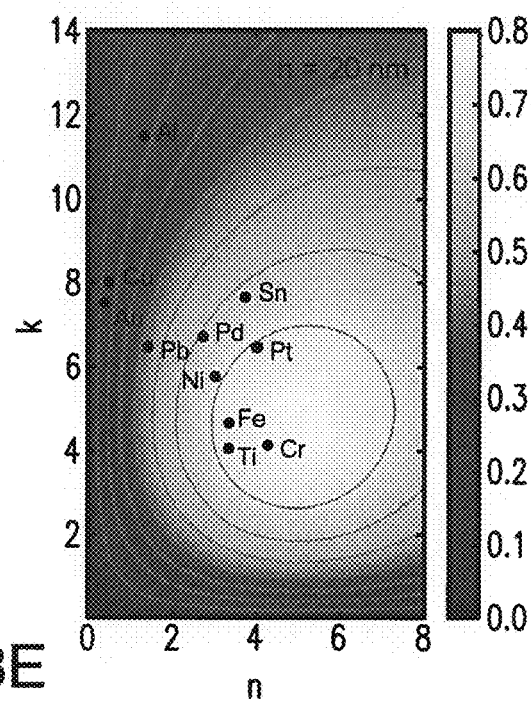
Figure 3F:
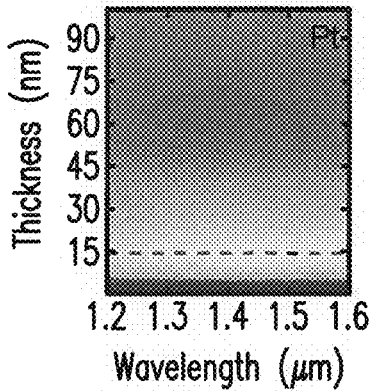
FIGS. 3F-3I are diagrams representative of the absorption in the subject device using Pt, Fe, Cr, and Ti, respectively.
Figure 3G:
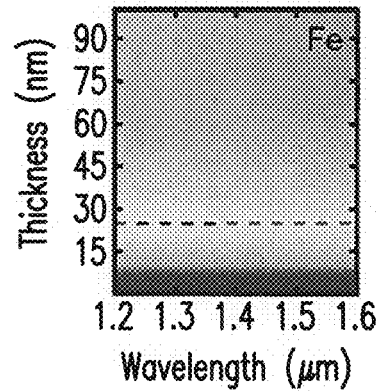
Figure 3H:
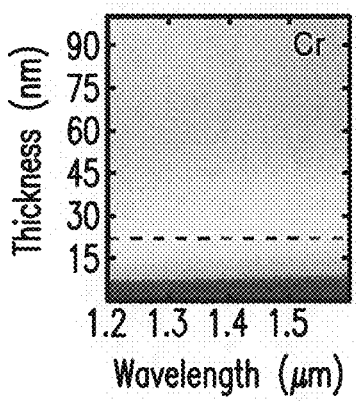
Figure 3I:
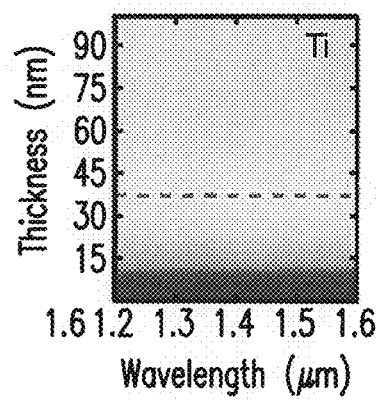

For larger thicknesses of the back side metal film, the resonance condition can be met by many common materials. For example, at h=20 nm, platinum (Pt), iron (Fe), chromium (Cr), and titanium (Ti) prove to be good candidates due to their indices (n, κ) positioned in the center of the resonance peak (as shown in FIG. 3E).

Analytical calculations for these materials (Pt, Fe, Cr, Ti) with varying wavelength and thicknesses show broadband absorption above 70% for films as thin as 10 nm, as shown in FIGS. 3F-3I. The values of the optical indices for these calculations have been shown in E. D. Palik, "Handbook of Optical Constants of Solids", I-III (Elsevier, Inc., 1998); and, J. H. Weaver, et al., "Low-energy interband absorption in bcc Fe and hcp Co.", Phys. Rev. B. 19, 3850-3856 (1979).

The FP resonance is possible for these materials (Pt, Fe, Cr, Ti) as long as $h \ll \lambda_0/2\pi$. Therefore, high absorption is maintained across a broadband of sub-bandgap wavelengths (for Si) because the metal film thicknesses are ~100 times smaller than the sub-bandgap wavelengths (for Si). By comparing the absorption in each material (Pt, Fe, Cr, Ti), it has been observed that Pt maintains high absorption with the thinnest film.

The absorption was measured in the four thin films (Pt, Fe, Cr, Ti) for thicknesses corresponding to their theoretical calculated maximum absorption (shown in FIGS. 3F-3I).

Experimentally, each sample of the device 30 (shown in FIG. 2A) was fabricated with an antireflection coating 34 of SiNx having a thickness of ~165 nm on the top surface 36 of a double sided polished silicon wafer 32 to reduce the light reflection from the silicon body with a reflection minimum at a wavelength of ~1.3 μm.

The back side metal film 41 was then deposited on the silicon surface 42 opposite to the SiNx coating 34 to form a back side Schottky contact 40, as depicted in FIGS. 2A-2B.

FIGS. 4A-4D are representative of the comparison of the experimental and analytical results for metal films formed from Pt, Fe, Cr, and Ti, respectively. Each sample was illuminated from the front side of the silicon facilitated by the anti-reflection coating.

Figures 4A, 4B, 4C, 4D:
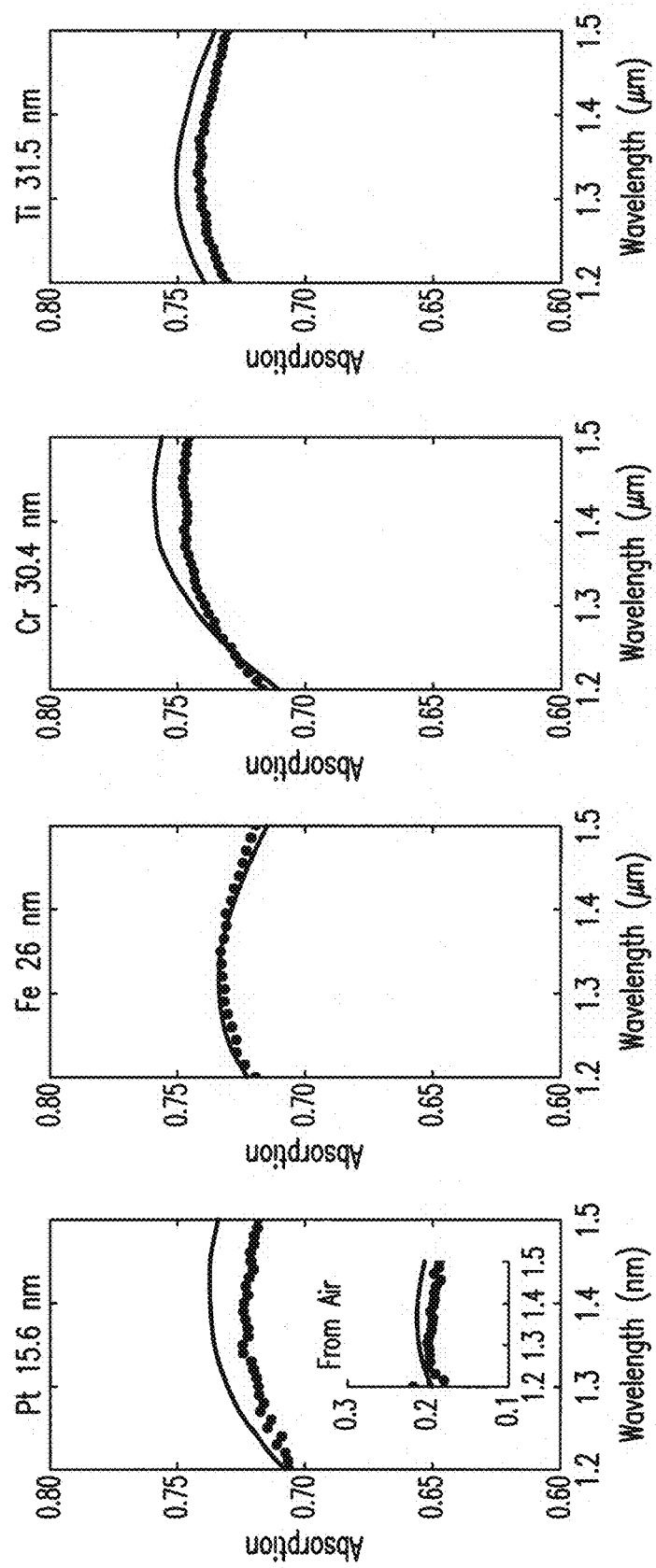
FIGS. 4A-4D are diagrams representative of absorption for Pt, Fe, Cr, and Ti based devices with metal film of different thicknesses.

As shown in FIG. 4C, Cr metal film appears to have the highest absorption with an average absorption of 73.7%. However, the thickness required for this absorption in the Cr film is double that of the Pt film (shown in FIG. 4A) which has an average absorption of 71.5% in the Pt film having the thickness of as small as 15.6 nm.

In agreement with Eq. 1, if the metal is illuminated directly from air, by reversing the sample orientation, the maximum absorption will be significantly reduced to 22%, with $n_t$~1 (air) and $n_b$~3.5 (Si), as shown in the inset in FIG. 4A.

The sample fabricated with the Pt film achieves maximum absorption for smaller layer thickness than the other metals, thus indicating that the probability for internal photoemission in this sample is larger. Also, the Pt film has a thin, relatively stable native oxide, emboldening its chance for usage in the subject photodetector.

Figure 5C:
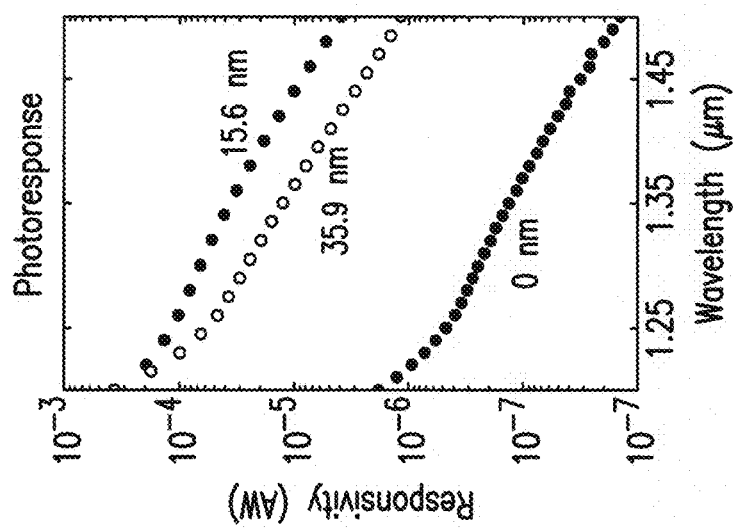
FIG. 5C is a diagram representative of the photoresponse in the subject device with Pt film having thicknesses of 15.6, 35.9 and zero nanometer (i.e., no Pt coating is formed) vs. the light wavelength.
Figure 5B:
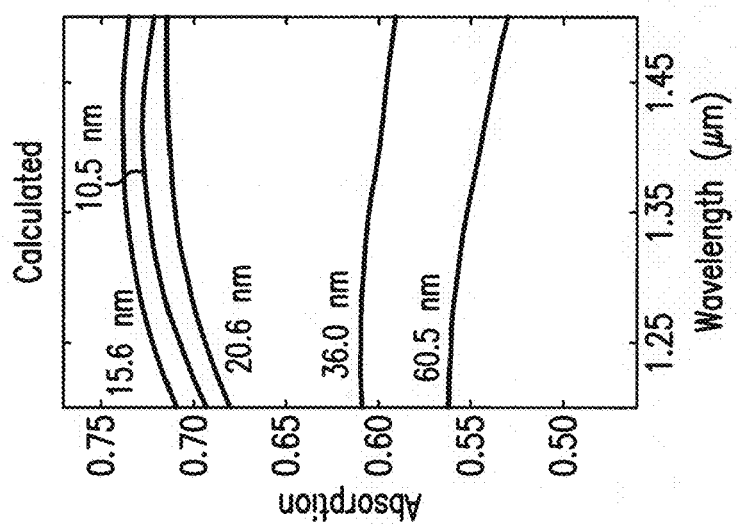
FIGS. 5A and 5B are diagrams representative of the experimental and calculated, respectively, absorption in the subject device with Pt film having thicknesses of 10.5, 15.6, 20.6, 36.0, and 60 nm.
Figure 5A:
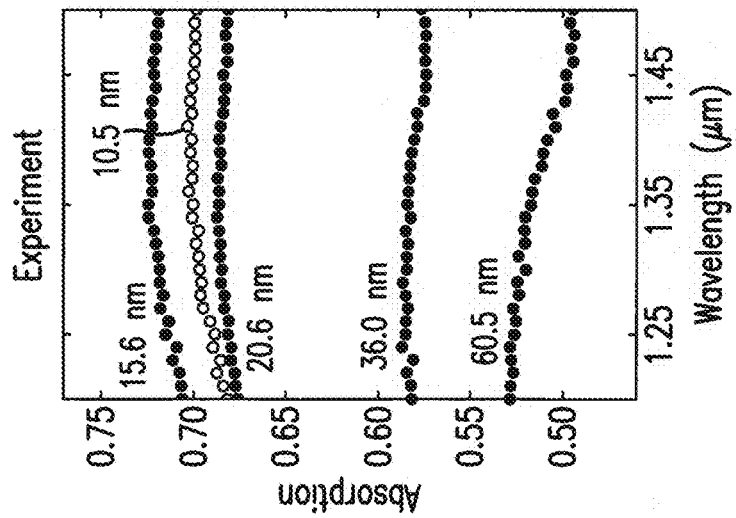

FIGS. 5A-5B depict the absorption measured and calculated, respectively, for various thicknesses of Pt to experimentally verify the optimal layer thickness for maximum absorption. The small film thickness of 15.6 nm maximizes the absorption. Increasing the film thickness by 5 nm only reduces the absorption by ~2-5%, showing that this method is robust and tolerant to fabrication errors.

In order for the absorption in the metal film to generate current, the absorbed radiation must excite hot electrons to the energy levels above the Schottky barrier, to be able to inject the exited electrons into the silicon to be collected as photocurrent. As a result, the measured photoresponse attained the range between $10^{-4}$ and $10^{-6}$ A/W at wavelengths 1.2-1.5 μm.

FIG. 5C depicts the measured photoresponse for devices with Pt films having the thicknesses of 0, 15.6 and 35.9 nm, respectively.

The device having Pt film of 15.6 nm thickness has 2-3 times higher photoresponse compared to the device having the Pt film of the thickness of the 35.9 nm because of its over 10% improvement in absorption, and greater probability of internal photoemission due to the shorter electron path length to the Schottky barrier.

The performance of the subject hot carrier photodetector has also been compared with the photoresponse of commercial and Si photodetectors when illuminating bare silicon. The measured $10^{-6}$-$10^{-8}$ A/W photoresponse of silicon is due to trap states. The hot carrier effect in the devices manufactured with Pt film on Si produces a $10^2$ increase in photocurrent.

For illumination beyond 1.25 µm, the subject hot carriers photodetector with the Pt film having the thickness of 15.6 nm demonstrates higher photoresponse than a commercial Si photodetector. This measurement confirms that thin film deposition of Pt is an effective and low-cost solution for extending the bandwidth of silicon photodetectors.

Figure 6A:
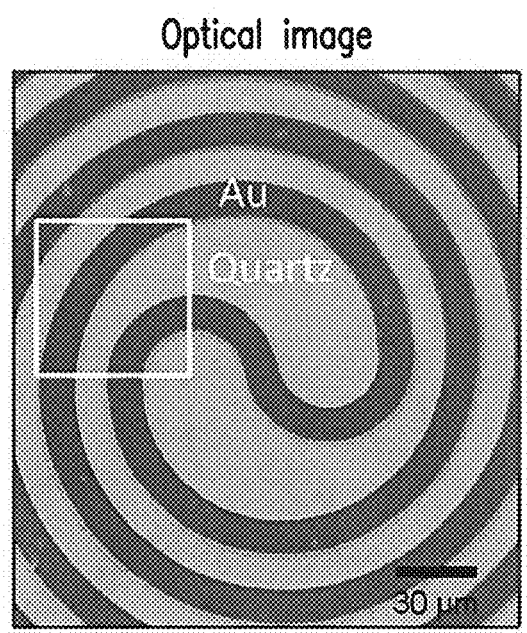
FIG. 6A is an optical image of the Au/Quartz structure taken with a confocal optical microscope.

To demonstrate this phenomenon, transmission images of a gold (Au) spiral on a quartz substrate (shown in FIG. 6A) were recorded with both a "bare" Si commercial detector (without the thin metal film) and the hot carriers detector fabricated with the 15.6 nm Pt film under equivalent experimental conditions. In the maps shown in FIGS. 6A-6I, it is confirmed that quartz is transparent for all incident wavelengths, while the Au spiral allows no transmitted light.

As shown in FIGS. 6B-6I, the subject hot carrier detector produces a larger signal with the incident light having a wavelength of 1.3, 1.35 and 1.4 µm, respectively, over a commercial Si detector.

The commercial Si detector, as shown in FIGS. 6F-6I, also generates some current when illuminated at wavelengths below the Si bandgap, where photocurrent should theoretically go to zero due to the presence of trap states.

Due to the fact that the hot carrier Si detector was not optimized for the wavelengths at or above the bandgap of silicon, the commercial Si detector produces significantly greater photoresponse at the bandgap, as shown in FIGS. 6B and 6F.

While the hot carrier detector with the Pt film extends the bandwidth of silicon detectors, further modifications can improve its photoresponsivity. For example, reducing the barrier height (of the Schottky contact) through heavy doping at the interface between Si and Pt can result in both increased bandwidth of the photocurrent generated by electrons excited near the Fermi energy, as well as collection of photo-excited carriers from the d-band states.

Enhancements could also be made by using metal alloys for the Schottky contact to tune the optical properties of materials for greater absorption in thinner material thicknesses and to adjust the barrier heights for an increased hot carrier collection.

Hot carrier generation from sub-bandgap absorption in the metal contacts is a low cost solution to extend the bandwidth of semiconductor photodetectors and other photovoltaic devices. It has been shown that by selecting materials for the Schottky contact with approximately equal real and imaginary refractive indices, such as, for example, Pt planar contact to silicon, a nearly 80% absorption of broadband sub-bandgap light can be attained in a nanometer scale layer.

The hot carrier IR photodetector 30 was fabricated by depositing 15.6 nm thick Pt film on a silicon wafer and $10^{-4}$-$10^{-6}$ A/W photoresponse was attained for irradiation wavelengths of 1.2-1.5 µm.

Reducing the Schottky barrier height and tailoring the thin film optical properties through metal alloys improves the optical performance of the subject device. Simplicity of the geometry and fabrication process make the subject hot carrier phenomenon straightforward for incorporation into current commercial fabrication of silicon detectors.

Fabrication of the Subject Si-Based IR Photodetectors for Optical Measurements

A number of samples were fabricated on 368 µm thick, double side polished, <100> n-type silicon wafers (1-10 Ωcm).

For absorption measurements, wafers were pre-cleaned in a piranha etch (3:1 sulfuric acid (H2SO4) and hydrogen peroxide ($H_2O_2$)) to remove all organic material, a buffered oxide etch (BOE) was conducted to remove the native oxide. Wafers were subsequently dried under an $N_2$ stream.

After the pre-cleaning procedure, an anti-reflection coating of ~165 nm $SiN_x$ was deposited using an Oxford plasma enhanced chemical vapor deposition (PECVD) system, and the thin film absorbing metal contacts were deposited using an Angstrom E-Beam Evaporator at a deposition rate of ~1 Ås$^{-1}$ at a pressure of ~$2\times10^{-6}$ Torr.

Fabrication of the Subject Si-Based IR Photodetectors for Electrical Measurements Si wafers were cleaned using the same procedures as for optical measurements, and ohmic contacts were formed by depositing aluminum (Al) through a shadow mask in a thin strip pattern along the top surface of each device.

Subsequently, annealing at 425° C. in a forming gas of 96% Ar and 4% $H_2$ was performed.

The $SiN_x$ anti-reflection coating was then deposited in the routine similar to the fabrication of the cell for absorption measurements through a shadow mask protecting the Al ohmic contact.

Finally, after removing the native oxide from the back surface of Si wafer with BOE (Buffered Oxide Etch), the absorbing metal contacts were deposited in the same method as for the absorption measurements through a shadow mask allowing for multiple metal thicknesses to be deposited on the same device.

Optical and Electrical Measurements

Specific wavelengths were selected from a supercontinuum source using an acousto-optic tunable filter (AOTF). Absorption measurements were taken in a 6 inch integrating sphere with radiation at near-normal incidence of 12°.

Two Germanium-based (Ge) photodiodes were used to measure the light intensity inside the integrating sphere and to monitor power fluctuations of the incident beam's intensity. The signal from each Ge photodiode was measured using a lock-in amplifier.

Photoresponse signals of each sample, i.e., the Si-based IR photodetector, were measured using a lock-in amplifier. The power incident on the sample was simultaneously monitored with a calibrated Ge photodiode.

To determine the Schottky barrier height, IV curves were obtained, and the barrier height was determined by a fit to the experimental data.

Transmission Mapping

The maps depicted in FIGS. 6B-6I were obtained using a confocal optical microscope in transmission mode. The microscope was modified to focus the beam of the supercontinuum laser source with a 60× bottom objective (NA=0.7), illuminating the Au/Quartz structure shown in FIG. 6A. The detectors were mounted to detect light collected by the 20× objective (NA=0.45).

Principles of photonics, plasmonics and hot carrier behavior have been used to develop a new image sensor technology based on resonant absorption in thin metal films and the subsequent hot electron injection into a CMOS sensor. The subject design, method of fabrication, and testing of a single pixel device has been performed which demonstrated the ability to detect IR illumination using a thin metal structure on a Si substrate. The subject principles will make ubiquitous CMOS imaging sensors found in everyday electronics to record images in red, blue, green, and IR. It will enable thermal imaging on cell phones and other devices with wide-reaching applications ranging from bio-medical (e.g. detecting physiological changes) to the detection of failure mechanisms in mechanical or electronic devices/structures, fire detection, etc. Thus, there would be significant potential for both societal and economic impact of the subject system.

Optical design of metallic ultra-absorbers in the IR spectrum has been focused on the optical design (via numerical simulation) of absorbing metallic nanostructures (based on Au, Al, Cu, and Ni) on Si.

Figure 7A:
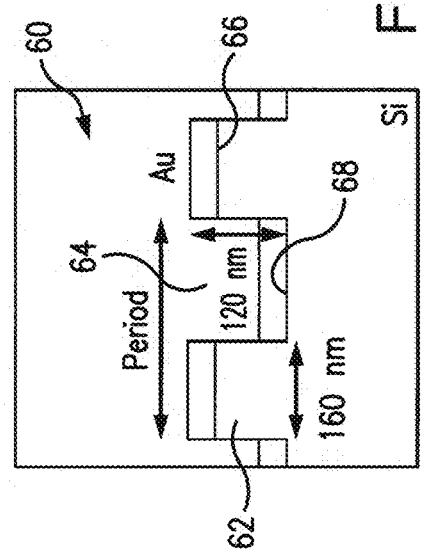
FIG. 7A is a schematic representation of a patterned nanostructure of Si—Au based hot plasmon photodetector capable of detecting sub-bandgap photons due to plasmonic excitation and hot carrier injection into silicon.
Figure 7B:
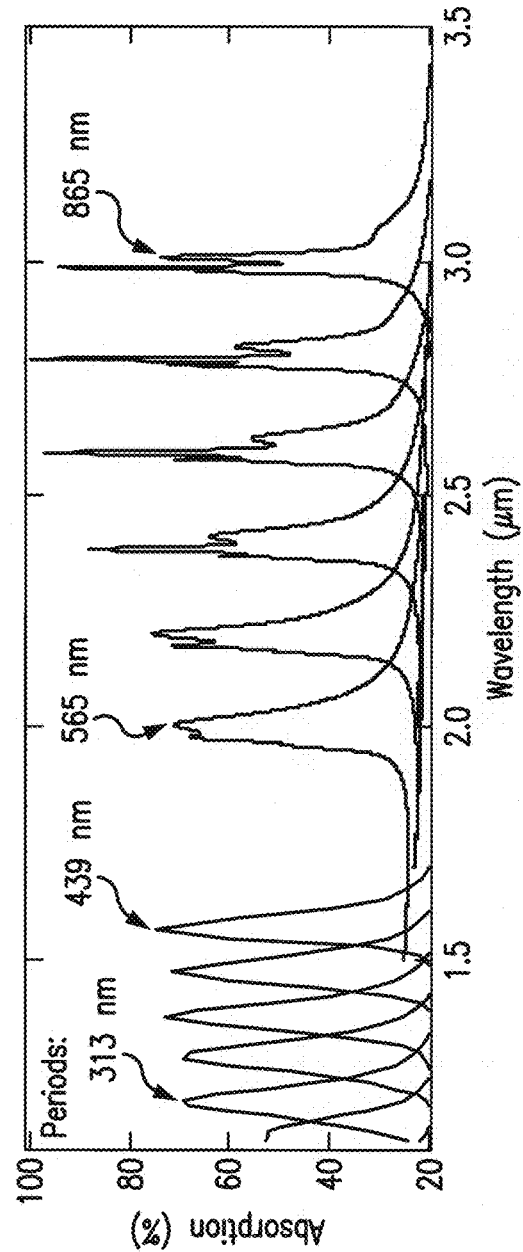
FIG. 7B is a diagram representative of simulated absorption for the structure shown in FIG. 7A with 15 nm thick Au film and different periodicities of the nanostructure.

Finite Difference Time Domain (FDTD) simulations have been used to design optical structures that allow for tailored absorption near the metal interface; and structural optimizations have been performed to tune absorption throughout the near-IR spectrum, as well as calculations of expected photo-injected current have been conducted in order to design optimized metallic nanostructures capable of either tunable narrowband and broadband absorption throughout the IR spectrum (1-2 µm) using Al, Cu, and Ni. Absorption have been obtained with Au which exceeded 60% over the desired frequency range, as shown in FIGS. 7A-7B.

Fabrication of metallic ultra-absorbers (hot carrier generation) has been focused on the fabrication of optical structures capable of absorbing light near the metal surface to generate hot carriers. FIGS. 8A-8F depict examples of high absorption optical nanostructures featuring thin metallic films thereon which may be used for the subject device as an alternative to a flat (non-patterned) thin metal film covering the back side surface of the Si waffle.

Lithography (photo- and e-beam) may be used to pattern optical structures followed by dry etching to create nano structure super-absorbers.

Wavelength and angle dependent absorption measurements have been conducted on the fabricated structures.

The principles underlying the device 30 shown in FIG. 2A, can be applied to the Si-based CMOS image sensor (photodetector) 60. Alternatively to the cell shown in FIG. 2A, where the thin metal film is flat (not patterned), the photodetector 60 shown in FIG. 7A constitutes a patterned nanostructure. The photodetector 60 has the Si wafer which may be patterned and subsequently covered with nanoscale film of, for example, Au. Alternatively, the Si material can remain flat (unpatterned), with the ultrathin metal film alone being patterned to form nano-lines (nano-islands) extending from the flat Si surface.

Alternatively to the IR Si-based photodetector 30 shown in FIGS. 2A-2B, which is based on the unpatterned (flat) ultrathin metal film 41, the Si material of the device 60 forms a number of erected lines (or islands) 62 separated one from another by trenches 64. The tops 66 of the lines (or islands) 62 and the bottoms 68 of the trenches 64 are covered with a thin layer of gold (Au). The nano-lines (or islands) 62 are separated from each other a predetermined distance, which constitutes the period of the patterned nanostructure of the device 60.

As the period of the nanostructure is increased, the absorption (which occurs in the metal film) is red-shifted by itself as shown in FIG. 7B. As a result, the absorption peak can be tuned throughout the IR spectrum, where the Si by itself is non-absorbing.

The patterning may be advantageous due to the fact that the narrowband operation can be tuned by changing the period (or width) of the nano-lines.

The energetic carriers excited within the gold are injected into the Si material, and subsequently are detected. For photons with sufficiently low energy ($\lambda > 2$ µm), carrier injection can be aided by applying an applied external bias.

Figure 8C:
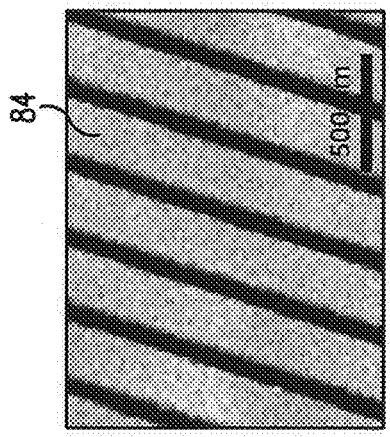
Figure 8B:
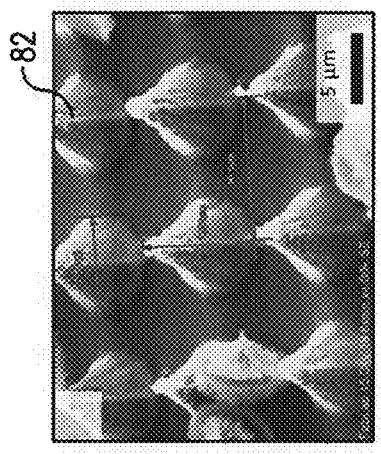
Figure 8A:
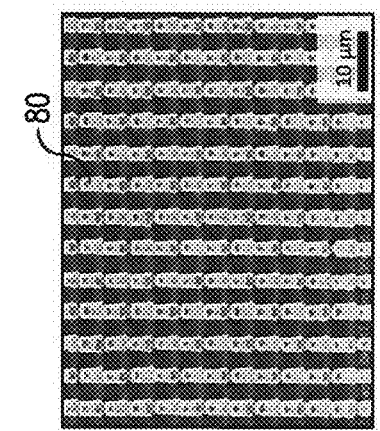
Figure 8F:
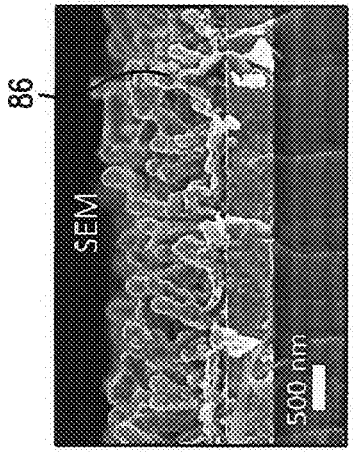
Figure 8E:
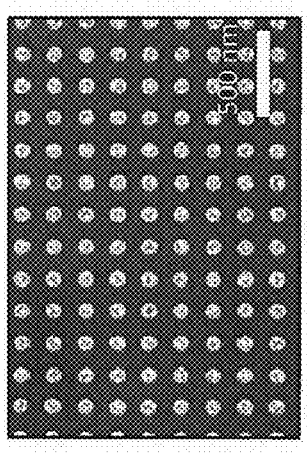
Figure 8D:
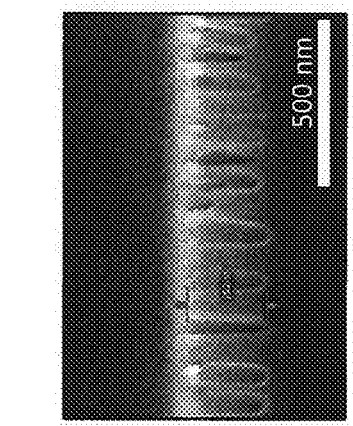

FIGS. 8A-8F are representative of some of the examples of an alternative design of the subject high absorption nanostructures. FIG. 8A depicts microwires 80; FIG. 8B shows microcones 82 created by dry etching of a GaAs wafer using Au micro-particles as an etch mask; FIG. 8C depicts metallic grating 84; FIG. 8D shows chemically etched black Si; FIG. 8E is a top view of a metallic nanodisk array deposited by mechanical masking and evaporation; and FIG. 8F is representative of a tobacco mosaic virus as a template which results in complex 3D nanostructures 86. All structures have been fabricated and tested.

An experimental test bed to measure the optoelectronic response of the subject Si based devices operating in the IR spectrum has been developed, and the optics was used that enabled detection of photo-injected carriers using visible light for IR illumination.

The measurement data demonstrated hot carrier collection for a CMOS-compatible pixel element.

Improvement strategies have been developed which include:
(a) For low collection efficiency for hot carriers, larger bias to reduce barrier height can be applied;
(b) Metals with different work functions can be used to enhance the probability of current flow;
(c) To obviate poor metal-insulator/semiconductor interface quality, annealing conditions can be modified and alloyed metals can be considered;
(d) Metal oxidation can be used to avoid introduction of interface defects (e.g., Al to $Al_2O_3$);
(e) Atomic layer deposition can be used for conformal coatings.

Metallic nanostructures capable of either tunable narrowband or broadband absorption throughout the IR (1-2 µm) spectrum using Au, Al, Cu, or Ni have been developed which demonstrated the absorption levels above 70% over the desired frequency range.

The present cells 10, 30, 60 are contemplated for incorporation as cells (pixels) in the next-generation RGB-IR CMOS imaging sensors for wide dissemination.

Figure 9:
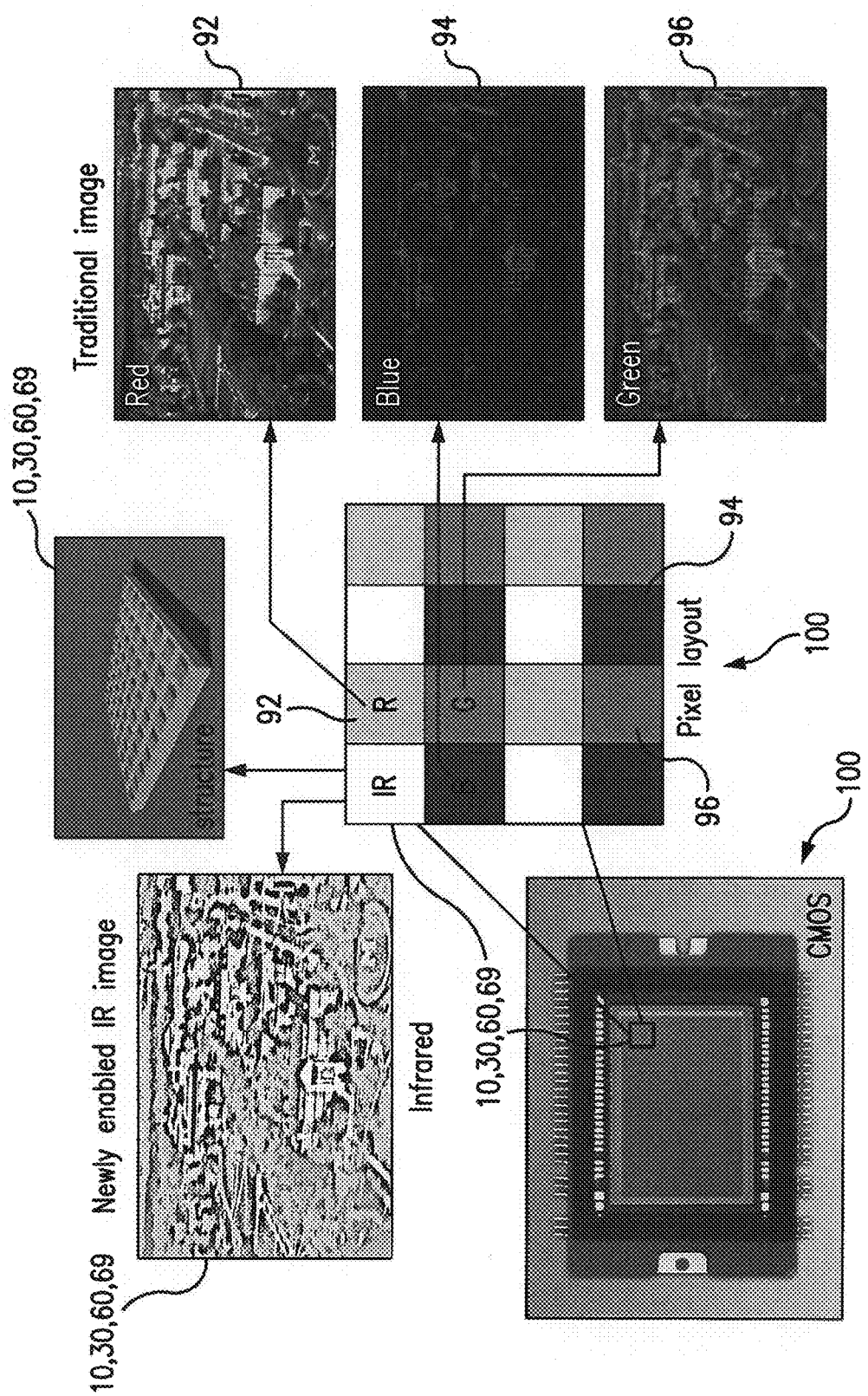
FIG. 9 is a schematic representation of a CMOS Si-based chip incorporating pixels (cells) with metallic nanostructures and Red, Blue, Green pixels (cells) enabling hot carrier injection and RBG-IR imaging.

Referring to FIG. 9, the subject silicon based IR photodetector cell 10, as well as the cells 30 (with the unpatterned back side thin metal film), and 60 (patterned to form super-absorbing nanostructures, for example, 80-86), are envisioned to be incorporated into the pixel layout 90 which includes subject cells for IR imaging, as well as red, blue, and green cells 92, 94, and 96, respectively, used in traditional imaging. The IR cells can be in the form of unpatterned (flat) cells or patterned nanostructures, shown, for example, in FIGS. 2A and 7A, respectively, or any other Si-based photodetectors adapted for the purposes of detection of IR illumination. The silicon based IR photodetectors with metallic nanostructures may be incorporated into a single CMOS chip 100, thus enabling multi-pixel display array to enable multi-spectra operation both in the IR spectrum and in the visible (RGB) spectrum.

Although this invention has been described in connection with specific forms and embodiments thereof, it will be appreciated that various modifications other than those discussed above may be resorted to without departing from the spirit or scope of the invention as defined in the appended claims. For example, functionally equivalent elements may be substituted for those specifically shown and described, certain features may be used independently of other features, and in certain cases, particular locations of elements, steps, or processes may be reversed or interposed, all without departing from the spirit or scope of the invention as defined in the appended claims.

What is claimed is:

1. Si-based photodetecting system operating in a bandwidth expanded into Infrared (IR) diapason, comprising:
at least one IR photodetecting cell manufactured with:
a Si (silicon) substrate having a first surface and a second surface opposite to said first surface, wherein said silicon has a Si energy bandgap;
a Schottky contact formed on said second surface of said Si substrate, said Schottky contact including a thin conductive film having a nanometer scale thickness h and formed in substantially contiguous contact with said second surface of said Si substrate, thereby creating an energetic barrier having a height $q\Phi_B$ between said Si substrate and said thin conductive film; and
an anti-reflection coating formed on said first surface of said Si substrate, and an ohmic contact formed on at least a portion of said first surface of said Si substrate;
wherein, upon illumination of said first surface of said Si substrate with a radiation having an in air wavelength $\kappa_0$ and having photons energy below said Si energy bandgap, said radiation passes through said Si substrate in a direction towards said second surface thereof, is absorbed in said thin conductive film of said Schottky contact, and excites hot carriers having an excitation energy exceeding said barrier height $q\Phi_B$, and wherein said hot carriers are injected in said Si substrate through said barrier, thus creating a photoresponse to said incident radiation.

2. The Si-based photodetecting system of claim 1, further including at least first and second electrical connections, each coupled to a respective one of said ohmic contact and said thin conducting film, wherein said photoresponse is obtained between said first and second electrical connections.

3. The Si-based photodetecting system of claim 1, wherein said thin conducting film has a refractive index $m=n+ik$, wherein $n \approx \kappa >> 0$, and wherein n and k are real and imaginary parts of the refractive index m, respectively.

4. The Si-based photodetecting system of claim 1, wherein said thin conducting film is formed from a material including at least one of Pt, Fe, Cr, Ti, Cu, Al, Ni, Au, and alloys thereof.

5. The Si-based photodetecting system of claim 1, wherein said anti-reflection coating is formed from a dielectric material having a refractive index smaller than a refractive index of Si.

6. The Si-based photodetecting system of claim 1, wherein said thickness h of said thin film is shorter than said wavelength $\lambda_0$ of said incident radiation, $h << \lambda_0/2\pi$.

7. The Si-based photodetecting system of claim 1, wherein said thickness h of said thin conductive film falls in a nanometer range.

8. The Si-based phoodetecting system of claim 1, wherein the wavelength $\lambda_0$ of the incident radiation falls in the IR diapason, said wavelength $\lambda_0$ exceeding 1.1 μm.

9. The Si-based photodetecting system of claim 1, wherein said Schottky contact barrier height $q\Phi_B$ is tuned to control said photoresponse.

10. The Si-based photodetecting system of claim 9, wherein said Schottky contact barrier height $q\Phi_B$ is reduced by heavily doping said Si substrate in proximity to said thin conductive film.

11. The Si-based photodetecting system of claim 9, wherein said Schottky contact barrier height $q\Phi_B$ is tuned by applying an external bias voltage thereto.

12. The Si-based photodetecting system of claim 1, wherein said Si substrate is an n-type Si.

13. The Si-based photodetecting system of claim 1, wherein said photodetecting system includes a Si-based Complementary Metal-Oxide-Semiconductor (CMOS) image sensor formed with at least one said IR photodetecting cell.

14. The Si-based photodetecting system of claim 13, wherein said Si-based CMOS image sensor includes a CMOS chip incorporating said at least one IR photodetecting cell and red-green-blue (RGB) elements operatively interconnected therebetween in a pixel array.

15. The Si-based photodetecting system of claim 1, wherein said at least one of said second surface of said Si substrate and said thin conducting film in said at least one IR photodetecting cell is patterned to form a periodical nanostructure, including at least one of conducting microwires, microcones, metallic grating, metallic nanodisk array, 3-D nanostructures, and combinations thereof, said periodical nanostructure including said thin conductive film.

16. The Si-based photodetecting system of claim 1, wherein said second surface of said Si substrate is substantially flat, and wherein said thin conductive film is an unpatterned film.

* * * * *